(12) United States Patent
Kim

(10) Patent No.: US 8,377,826 B2
(45) Date of Patent: Feb. 19, 2013

(54) FIN MASK AND METHOD FOR FABRICATING SADDLE TYPE FIN USING THE SAME

(75) Inventor: Kwang-Ok Kim, Ichon-shi (KR)

(73) Assignee: Hynix Semiconductor Inc., Icheon-si (KR)

( * ) Notice: Subject to any disclaimer, the term of this patent is extended or adjusted under 35 U.S.C. 154(b) by 21 days.

(21) Appl. No.: 12/891,701

(22) Filed: Sep. 27, 2010

(65) Prior Publication Data

US 2011/0014792 A1    Jan. 20, 2011

Related U.S. Application Data

(62) Division of application No. 12/495,292, filed on Jun. 30, 2009, now abandoned, which is a division of application No. 11/679,179, filed on Feb. 26, 2007, now abandoned.

(30) Foreign Application Priority Data

Jun. 30, 2006 (KR) .......................... 10-2006-0061437
Dec. 15, 2006 (KR) .......................... 10-2006-0128839

(51) Int. Cl.
*H01L 21/32* (2006.01)

(52) U.S. Cl. ........ 438/703; 438/702; 257/212; 257/296; 257/314; 257/315; 257/330; 257/E27.084

(58) Field of Classification Search .................. 257/212, 257/315; 438/51, 703, 702
See application file for complete search history.

(56) References Cited

U.S. PATENT DOCUMENTS

| 6,660,462 | B1 | 12/2003 | Fukuda | |
|---|---|---|---|---|
| 2004/0043623 | A1* | 3/2004 | Liu et al. | 438/736 |
| 2005/0077568 | A1* | 4/2005 | Park et al. | 257/330 |
| 2007/0020565 | A1* | 1/2007 | Koh et al. | 430/313 |
| 2007/0057312 | A1* | 3/2007 | Kim | 257/315 |

FOREIGN PATENT DOCUMENTS

| KR | 1020060064175 A | 6/2006 |
|---|---|---|
| KR | 1020070070922 A | 7/2007 |
| KR | 1020070070924 A | 7/2007 |

* cited by examiner

*Primary Examiner* — N Drew Richards
*Assistant Examiner* — John P Dulka
(74) *Attorney, Agent, or Firm* — Kilpatrick Townsend & Stockton LLP

(57) ABSTRACT

A fin mask for forming saddle type fins in each of active regions formed in an island shape having a certain size with a major axis and a minor axis includes a first fin mask of a line type, and a second fin mask of an island type, wherein the first fin mask and the second fin mask in combination expose saddle type fin regions and cover ends of the neighboring active regions along the major axis.

17 Claims, 12 Drawing Sheets

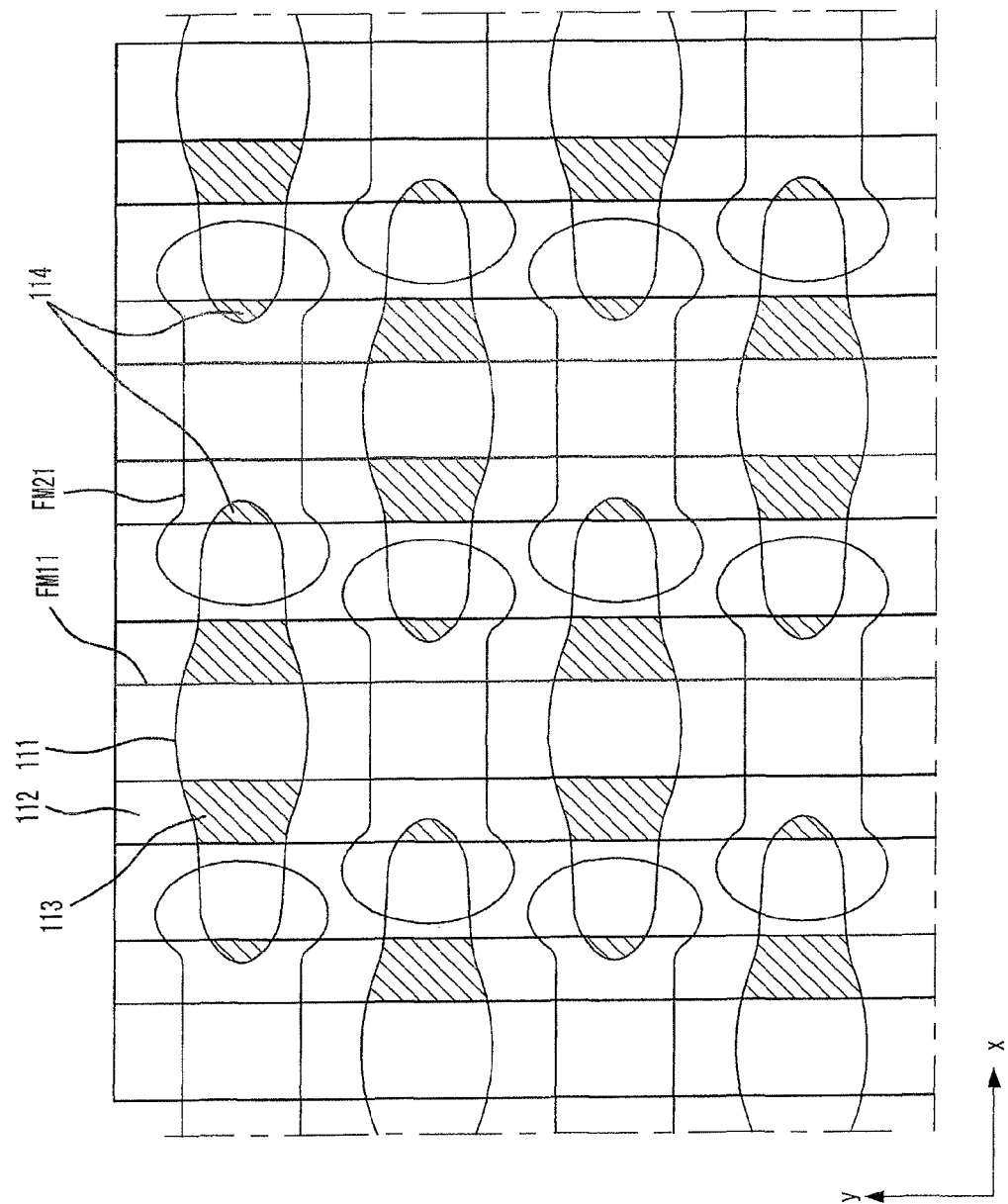

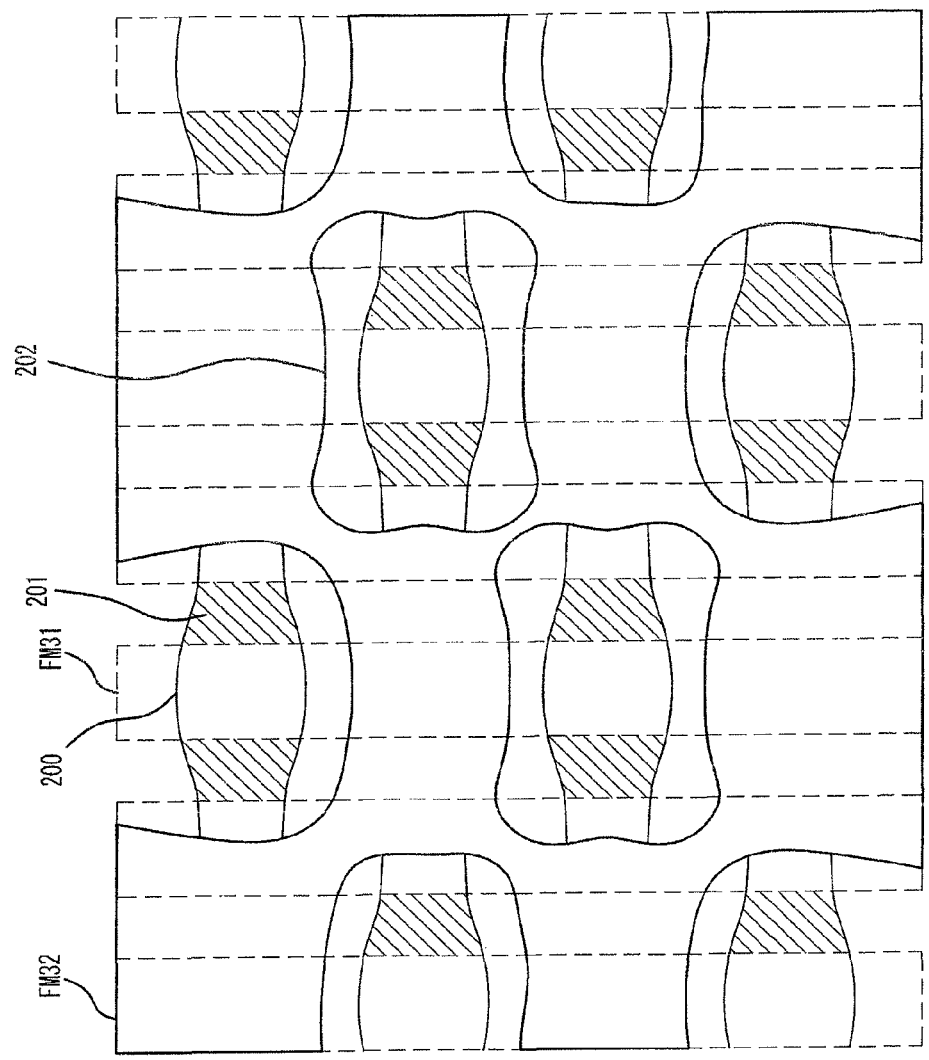

FIN MASK AND METHOD FOR FABRICATING SADDLE TYPE FIN USING THE SAME

CROSS-REFERENCES TO RELATED APPLICATIONS

The present application is a divisional of U.S. patent application Ser. No. 12/495,292, filed on Jun. 30, 2009, which is a divisional of U.S. patent application Ser. No. 11/679,179, filed on Feb. 26, 2007, which claims priority to Korean patent application numbers 10-2006-0061437 and 10-2006-0128839, filed on Jun. 30, 2006 and Dec. 15, 2006, respectively, which are incorporated by reference in their entirety.

BACKGROUND OF THE INVENTION

The present invention relates to a method for fabricating a semiconductor device, and more particularly, to a method for fabricating a saddle type transistor having a saddle type fin.

A typical cell in a three-dimensional structure for use in a dynamic random access memory (DRAM) cell includes a fin structure, a recess channel structure, and a saddle type structure. The saddle type structure includes the fin structure and the recess channel structure in combination.

FIG. 1A illustrates a perspective view showing a method for fabricating a typical saddle type transistor, and FIG. 1B illustrates a plan view of a fin mask. Referring to FIGS. 1A and 1B, an isolation structure 12 is formed in a substrate 11 using a shallow trench isolation (STI) process. Thus, an active region 11A having a major axis and a minor axis is defined. A fin mask 13 is formed over the substrate structure. Saddle type fins 14 are formed by etching using the fin mask 13. The etching for forming the saddle type fins 14 may include etching the isolation structure 12 using the fin mask 13 and then etching the active region 11A, or etching the active region 11A and then etching the isolation structure 12. The fin mask 13 is removed, and although not illustrated, a gate oxide layer, a gate electrode, and source/drain are formed to complete a saddle type transistor.

The typical method as described above uses the line type fin mask 13 to form the saddle type fins 14. However, in the typical method, the active region 11A is exposed by the line type fin mask 13 at regions predetermined for forming the saddle type fins 14 as well as at the ends of the active region 11A along the major axis. Thus, dummy saddle type fins 14A may be formed. The dummy saddle type fins 14A may be formed in an active region that will be connected to a storage node. Thus, leakage of the storage node and capacitance of the gate may be increased, deteriorating performance of the transistor.

SUMMARY OF THE INVENTION

Embodiments of the present invention are directed towards providing a fin mask and a method for fabricating a saddle type fin using the same, which can reduce formation of undesired dummy saddle type fins at the end of an active region along a major axis.

In accordance with an aspect of the present invention, there is provided a fin mask for forming saddle type fins in each of active regions formed in an island shape having a certain size with a major axis and a minor axis, the fin mask including: a first fin mask of a line type; and a second fin mask of an island type, wherein the first fin mask and the second fin mask in combination expose saddle type fin regions and cover ends of the neighboring active regions along the major axis.

In accordance with another aspect of the present invention, there is provided a fin mask for forming saddle type fins in each of active regions formed in an island shape having a certain size with a major axis and a minor axis, the fin mask including: a first fin mask of a line type; and a second fin mask having openings, wherein the first fin mask and the second fin mask in combination expose saddle type fin regions and cover ends of the neighboring active regions along the major axis.

In accordance with a still another aspect of the present invention, there is provided a fin mask for forming saddle type fins in each of active regions formed in an island shape having a certain size with a major axis and a minor axis, the fin mask including island-shaped openings exposing saddle type fin regions and covering the rest of the active regions.

In accordance with a further aspect of the present invention, there is provided a method for fabricating a saddle type fin, including: providing a substrate defining at least two active regions that have neighboring ends in a major axis; forming an etch barrier pattern over the substrate, the etch barrier pattern exposing saddle type fin regions of the active regions and covering the rest of the active regions; and etching the saddle type fin regions to form saddle type fins in a local damascene structure, wherein forming the etch barrier pattern includes forming a first fin mask and a second fin mask, and wherein the first fin mask exposes the saddle type fin regions in a line pattern and the second fin mask covers the neighboring ends of the active regions.

BRIEF DESCRIPTION OF THE DRAWINGS

FIG. 5A illustrates a plan view of a fin mask combination used in fabricating a saddle type fin according to a second embodiment of the present invention.

FIG. 6A illustrates a plan view of a fin mask combination used in fabricating a saddle type fin according to a third embodiment of the present invention.

DESCRIPTION OF SPECIFIC EMBODIMENTS

The present invention relates to a fin mask and a method for fabricating a saddle type fin using the same. Formation of dummy saddle type fins at the ends of neighboring active regions along a major axis may be reduced through using a fin mask combination that locally opens saddle type fin regions.

Thus, leakage of the storage node and increased gate capacitance caused by the dummy saddle type fins may be reduced.

Figure 1A:
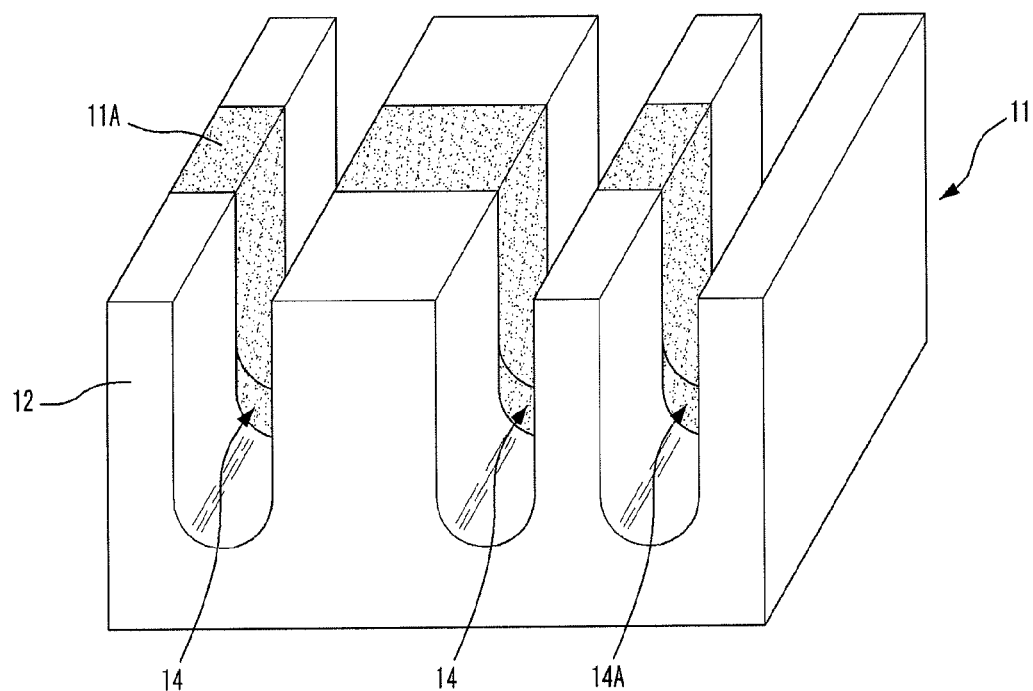
FIG. 1A illustrates a perspective view of a typical method for fabricating a saddle type fin.
Figure 1B:
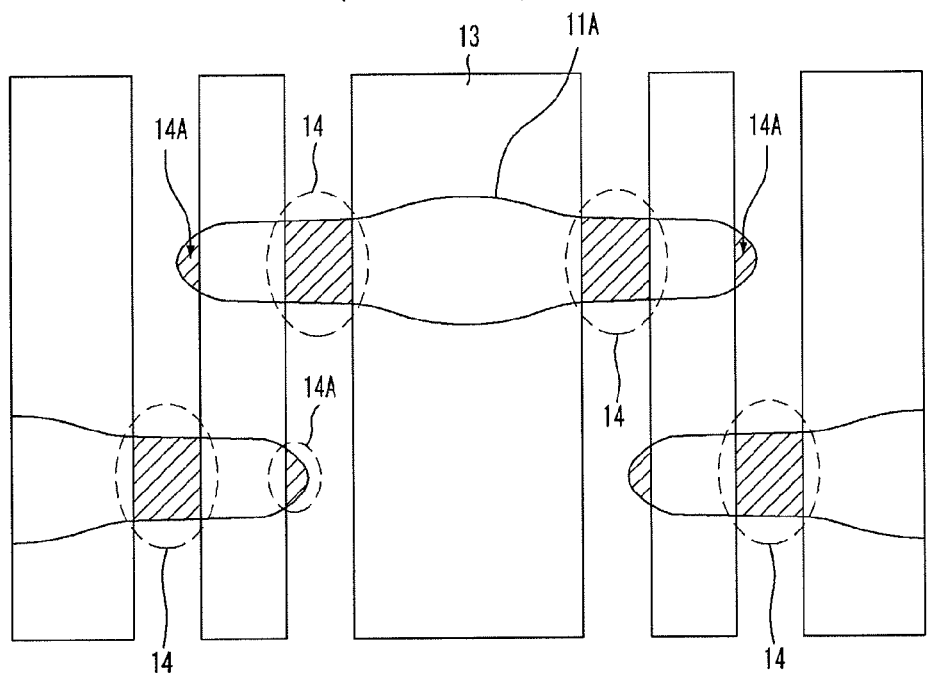
FIG. 1B illustrates a plan view of a typical fin mask.
Figure 2:
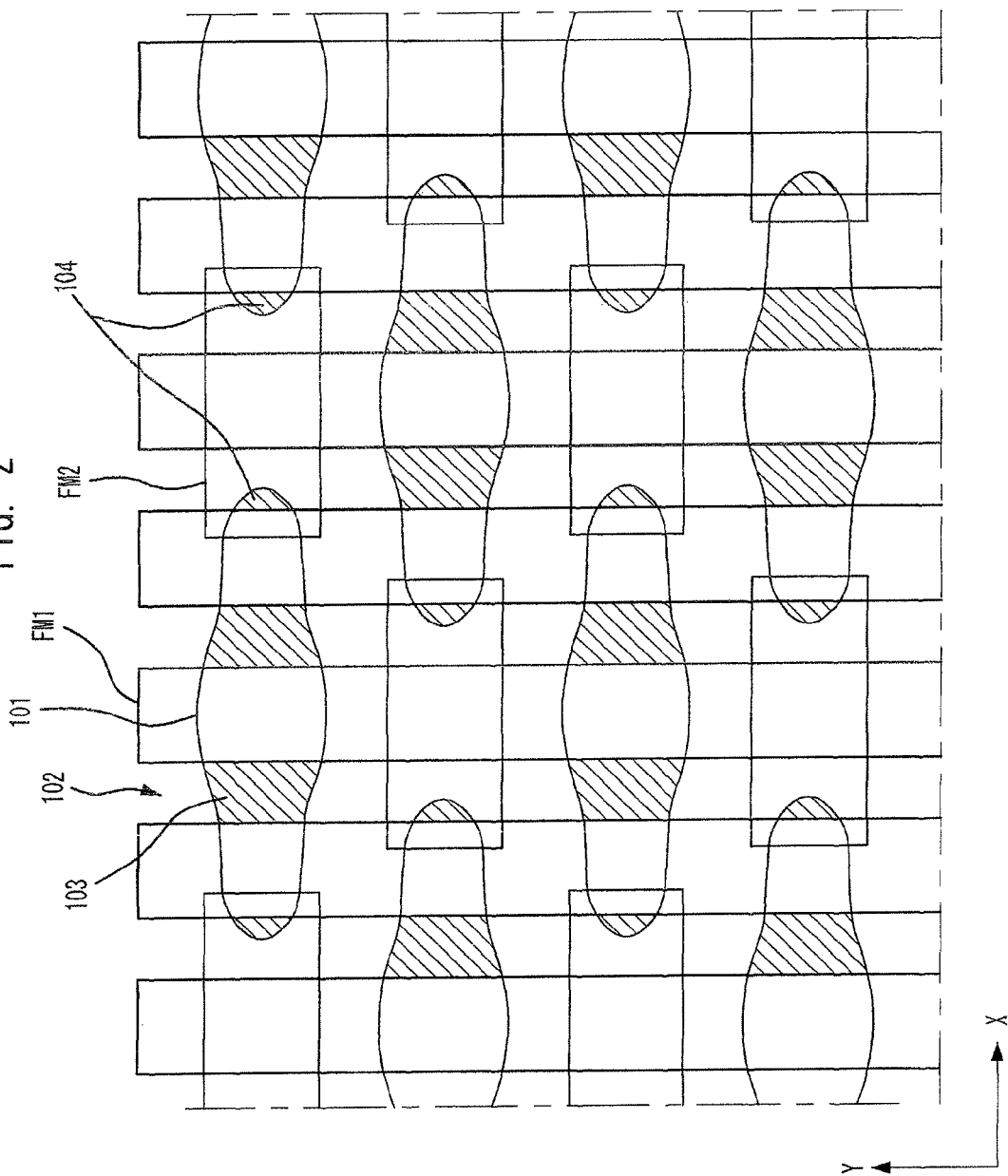
FIG. 2 illustrates a plan view of a fin mask combination used in fabricating a saddle type fin according to a first embodiment of the present invention.

FIG. 2 illustrates a plan view of a fin mask combination used in fabricating a saddle type fin according to a first embodiment of the present invention. A plurality of active regions 101 are formed in a substrate. The substrate has a flat surface with an X axis and a Y axis. The active regions 101 are formed in a certain size with a major axis and a minor axis. The active regions 101 are disposed in a manner that ends 104 along the major axis of two neighboring active regions 101 along the X axis are adjacent to each other, and an isolation structure 102 is formed between the adjacent active regions 101. Hereinafter, only one set of elements are described for convenience.

The active region 101 is defined by the isolation structure 102. Forming a fin mask according to the first embodiment includes using a first fin mask FM1 and a second fin mask FM2 in combination to form saddle type fins 103. The active region 101 and the isolation structure 102 are selectively etched to form the saddle type fins 103, that is, the active region 101 protruding in a saddle type structure. In the present embodiment, the first fin mask FM1 and the second fin mask FM2 may be sequentially used according to a given order, and the given order may be changeable. For instance, the first fin mask FM1 may be formed first and the second fin mask FM2 may be formed after the first fin mask FM1 is removed. On the other hand, the second fin mask FM2 may be formed first and the first fin mask FM1 may be formed after the second fin mask FM2 is removed. However, FIG. 2 illustrates both the first and second fin masks FM1 and FM2 together to show the relative position of the first and second fin masks FM1 and FM2.

The first fin mask FM1 is a line type mask that is formed along a first direction, and the second fin mask FM2 is an island type mask that is formed along a second direction that is orthogonal to the first direction. Using the first fin mask FM1 and the second fin mask FM2 in combination allows selectively etching portions of the active region 101 and the isolation structure 102 predetermined for forming the saddle type fins 103. That is, portions where dummy saddle type fins usually occur (i.e., the ends 104 along the major axis of two neighboring active regions 101 along the X axis) are not etched during an etching process for forming the saddle type fins 103. This result may be obtained because the island type second fin mask FM2 is applied.

For instance, the second fin mask FM2 may be an island type mask of a rectangular shape formed to cover the ends 104 along the major axis of the neighboring active regions 101 and cover the isolation structure 102 between the two active regions 101. The second fin mask FM2 is formed at least partly to intersect the location where the first fin mask FM1 was formed. The first fin mask FM1 and the second fin mask FM2 may be applied in a certain order. A hard mask pattern transcribing the shape of the first fin mask FM1 and the second fin mask FM2 in combination is used as an etch barrier when forming the saddle type fins 103.

FIGS. 3A to 3E illustrate cross-sectional views of a method for fabricating a saddle type fin according to the first embodiment of the present invention.

Figure 3A:
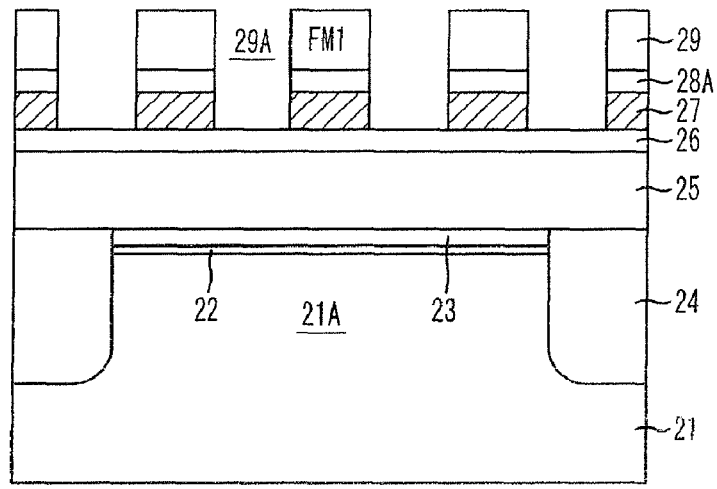
FIGS. 3A to 3E illustrate cross-sectional views of a method for fabricating a saddle type fin according to the first embodiment of the present invention.

Referring to FIG. 3A, an isolation structure 24 is formed in a substrate 21 using a shallow trench isolation (STI) process. The isolation structure 24 defines an active region 21A. A pad oxide layer 22 and a pad nitride layer 23 are formed over the active region 21A. In more detail, the STI process includes forming an oxide-based layer and a nitride-based layer over the substrate 21 in sequential order when forming the isolation structure 24. An etching process is performed to form trenches in the substrate 21 using an STI mask. The STI mask is removed. An insulation layer (e.g., a high density plasma (HDP) oxide layer) is filled in the trenches, and a chemical mechanical polishing (CMP) process is performed. Consequently, the pad oxide layer 22 and the pad nitride layer 23 are formed over the active region 21A after the CMP process is performed. The active region 21A includes an island type pattern having a major axis and a minor axis. In a plan view, the active region 21A has substantially the same shape and layout as the active regions 101 shown in FIG. 2.

An amorphous carbon layer 25, a dielectric anti-reflective coating (DARC) layer 26, a polysilicon hard mask 27, and a first patterned bottom anti-reflective coating (BARC) layer 28A are formed over the resulting substrate structure. In more detail, the amorphous carbon layer 25, the DARC layer 26, a polysilicon hard mask layer, and a first BARC layer are formed over the substrate structure. The selectivity between the DARC layer 26 and the amorphous carbon layer 25 is approximately 10:1 or higher. Thus, the DARC layer 26 functions as a hard mask when etching the amorphous carbon layer 25. The polysilicon hard mask layer functions as a hard mask when etching the DARC layer 26. Both the DARC layer 26 and the polysilicon hard mask layer may have a thickness of approximately 1,000 Å or less. The amorphous carbon layer 25 may be used as a hard mask for forming a subsequent saddle type fin. The amorphous carbon layer 25 may have a thickness of approximately 500 Å or greater.

A first fin mask (FM1) 29 is formed over the first BARC layer. The FM1 29 includes a photoresist layer patterned by a photo-exposure and developing process. The FM1 29 includes line type first openings 29A exposing saddle type fin regions. That is, the FM1 29 is formed in a line mask shape, wherein the first openings 29A are formed to intersect with the major axis of the active region 21A. The active region 21A and the FM1 29 are disposed in substantially the same manner as the active regions 101 and the first fin mask FM1 shown in FIG. 2.

An etching process is performed to etch the first BARC layer and the polysilicon hard mask layer using the FM1 29 as an etch mask. Consequently, the first patterned BARC layer 28A and the polysilicon hard mask 27 are formed. Thus, the polysilicon hard mask 27 is formed in a line type pattern, transcribing the shape of the FM1 29.

Figure 3B:
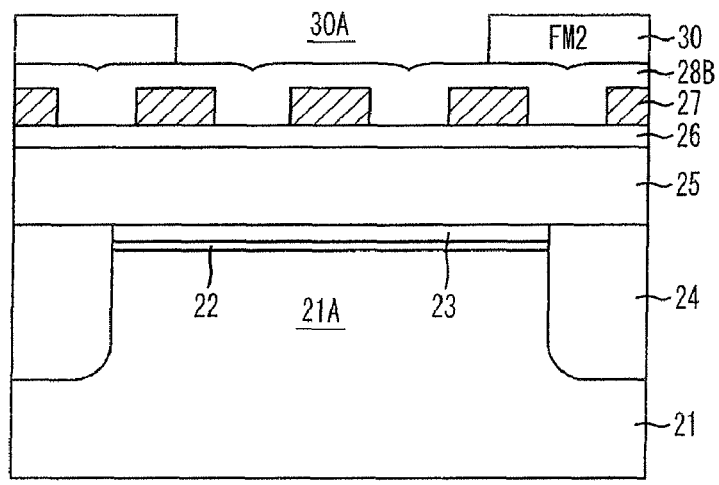

Referring to FIG. 3B, the FM1 29 is removed. The first patterned BARC layer 28A is also removed at this time. A second BARC layer 28B is formed over the resultant substrate structure. A second fin mask (FM2) 30 is formed over the second BARC layer 28B. The FM2 30 includes a photoresist layer patterned by a photo-exposure and developing process. In a plan view, the FM2 30 covers the ends of two neighboring active regions 21A along the major axis. Thus, the FM2 30 exposes the saddle type fin regions through a second opening 30A, and yet covers the ends of the active regions 21A along the major axis where the dummy saddle type fins may form and the isolation structure 24 formed between the ends. The FM2 30 is formed in an island shape. Thus, the FM2 30 and the FM1 29 are shaped differently.

Figure 3C:
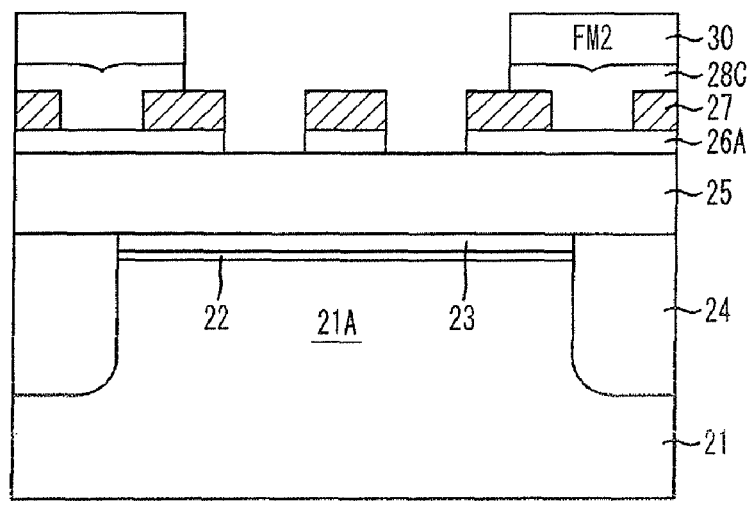
Figure 3D:
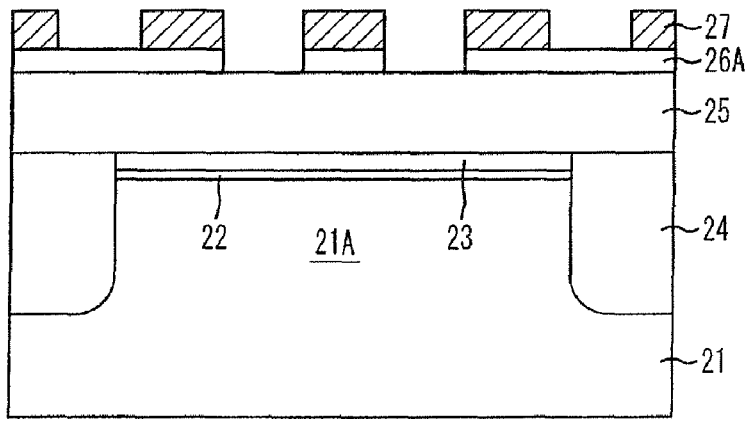

Referring to FIG. 3C, an etching process is performed using the FM2 30 as an etch mask. That is, the second BARC layer 28B and the DARC layer 26 are etched to form a patterned second BARC layer 28C and a patterned DARC layer 26A. At this time, the polysilicon hard mask 27 may not be etched. Thus, the DARC layer 26 below the polysilicon hard mask 27 is etched in a manner such that the patterned DARC layer 26A is self-aligned by the polysilicon hard mask 27. Referring to FIG. 3D, the FM2 30 is removed. The patterned second BARC layer 28C is also removed at this time.

Figure 3E:
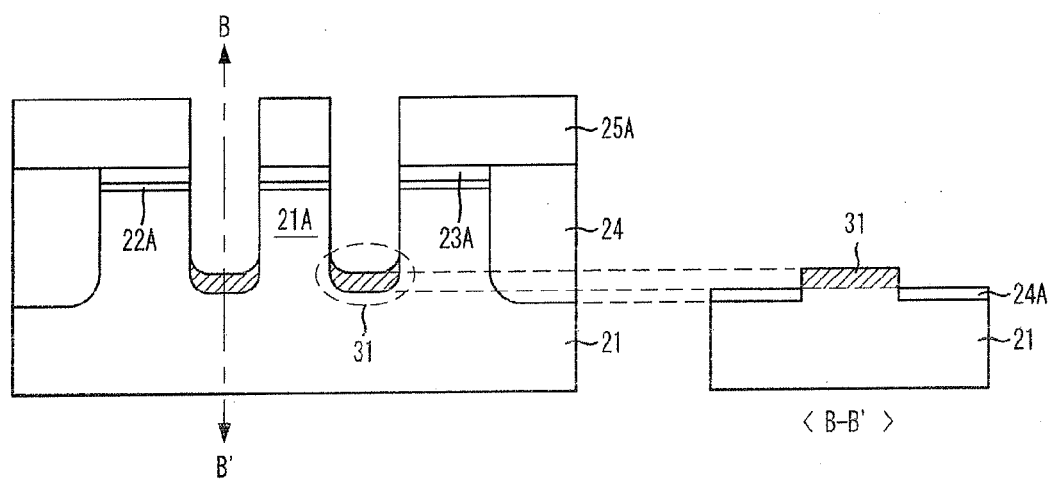
Figure 4:
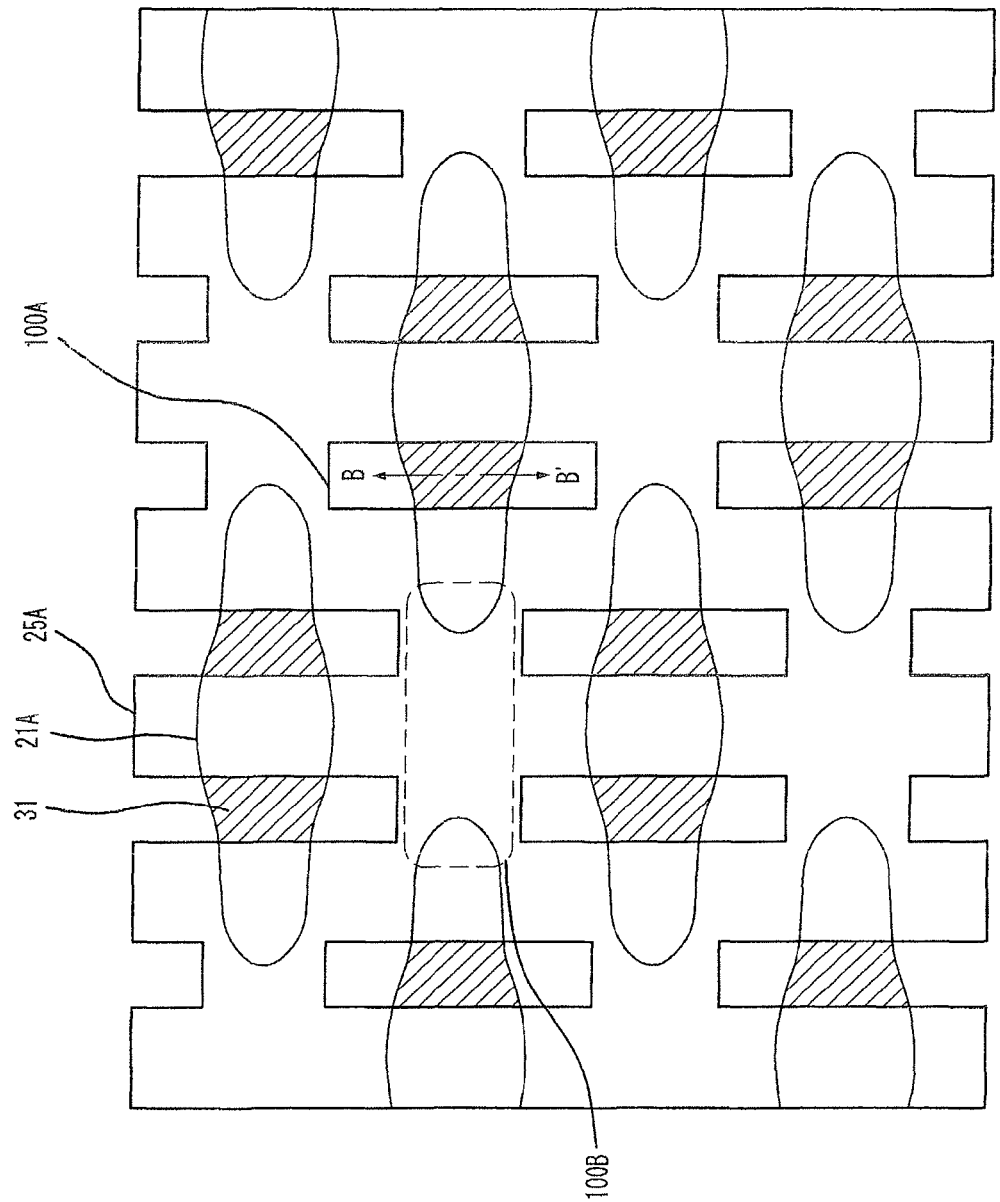
FIG. 4 illustrates resultant saddle type fins according to the first embodiment of the present invention.

Referring to FIG. 3E, the polysilicon hard mask 27 is removed. The amorphous carbon layer 25 is etched to form an amorphous carbon pattern 25A using the patterned DARC layer 26A as a mask. A plan view of the amorphous carbon pattern 25A transcribing the shape of the patterned DARC layer 26A is shown in FIG. 4. The pad nitride layer 23 and the pad oxide layer 22 are etched to form a patterned pad nitride layer 23A and a pad oxide layer 22A. The isolation structure 24 and the active region 21A are then selectively recessed to form saddle type fins 31. Reference numeral 24A represents recessed portions of the isolation structure 24. The patterned DARC layer 26A is etched away when forming the saddle type fins 31. The amorphous carbon pattern 25A functions as an etch barrier.

The amorphous carbon pattern 25A prevents the etching of the ends of two neighboring active regions 21A along the major axis when forming the saddle type fins 31. Consequently, only the saddle type fin regions (refer to line B-B') of the active region 21A and the isolation structure 24 are etched. The active regions 21A and the isolation structure 24 at the ends of the active regions 21A along the major axis where the dummy saddle type fins often occur may not be etched. The resultant saddle type fins 31 are described in a plan view in FIG. 4.

FIG. 4 illustrates the resultant saddle type fins according to the first embodiment of the present invention. The amorphous carbon pattern 25A formed by the combination of the FM1 29 and the FM2 30 exposes the saddle type fin regions (refer to line B-B') of the active regions 21A with rectangular type openings 100A. The amorphous carbon pattern 25A covers regions where dummy saddle type fins often occur as denoted with reference numeral 100B.

Accordingly, forming the saddle type fins 31 by etching using the amorphous carbon pattern 25A reduces the etching of the ends of the active regions 21A along the major axis. Thus, the dummy saddle type fins are not formed. The saddle type fin regions to be etched are defined in a rectangular shape by the rectangular type openings 100A and are locally etched. Thus, the saddle type fins 31 according to the first embodiment may be referred to as local damascene saddle type fins (LD-SF).

In the aforementioned first embodiment, the line type FM1 29 is used before using the island type FM2 30. However, an amorphous carbon pattern having substantially the same shape as the one shown in FIG. 4 may be obtained even when the island type FM2 30 is used before using the line type FM1 29.

FIG. 5A illustrates a plan view of a fin mask combination used in fabricating a saddle type fin according to a second embodiment of the present invention. A second fin mask (FM21) of the fin mask combination according to the second embodiment has a shape different from the second fin mask (FM2) according to the first embodiment.

A plurality of active regions 111 are formed in a substrate. The substrate has a flat surface with an X axis and a Y axis. The active regions 111 are formed in a particular size with a major axis and a minor axis. The active regions 111 are disposed in a manner that the ends 114 along the major axis of two neighboring active regions 111 along the X axis are adjacent to each other, and an isolation structure 112 is formed between the adjacent active regions 111. Hereinafter, only one set of elements are described for convenience.

The active region 111 is defined by the isolation structure 112. Forming a fin mask according to the second embodiment includes using a first fin mask FM11 and a second fin mask FM21 in combination to form saddle type fins 113. The active region 111 and the isolation structure 112 are selectively etched to form the saddle type fins 113, that is, the active region 111 protruding in a saddle type structure. In the present embodiment, the first fin mask FM11 and the second fin mask FM21 may be sequentially used according to a given order, and the given order may be changeable. For instance, the first fin mask FM11 may be formed first and the second fin mask FM21 may be formed after the first fin mask FM11 is removed. On the other hand, the second fin mask FM21 may be formed first and the first fin mask FM11 may be formed after the second fin mask FM21 is removed. However, FIG. 5A illustrates both the first and second fin masks FM11 and FM21 together to show the relative position of the first and second fin masks FM11 and FM21.

The first fin mask FM11 is a line type mask that is formed along a first direction, and the second fin mask FM21 is an island type mask that is formed along a second direction that is orthogonal to the first direction. The saddle type fin regions of the active region 111 and the isolation structure 112, where the saddle type fins 113 are to be formed, may be locally etched by combining the two fin masks. That is, portions where dummy saddle type fins usually occur (i.e., the ends 114 along the major axis of two neighboring active regions 111 along the X axis) are not etched during an etching process for forming the saddle type fins 113. This result may be obtained because the island type second fin mask FM21 is applied.

For instance, the second fin mask FM21 may be a dumbbell-shaped island type mask formed to cover the ends 114 along the major axis of the neighboring active regions 111 and cover the isolation structure 112 between the two active regions 111. The dumbbell-shaped island type mask includes a rectangular shape over the isolation structure 112 between the neighboring active regions 111. The dumbbell-shaped island type mask also includes a ball or an ellipse shape over the ends 114 of each active region 111 such that the dumbbell-shaped island type mask covers the ends 114 with an increased surface area. The second fin mask FM21 is formed to intersect at least partly the location where the first fin mask FM11 was formed.

The second fin mask FM21 is formed as the dumbbell-shaped island type mask according to the second embodiment unlike the second fin mask FM2 that is formed as a rectangular island type mask according to the first embodiment. Using the second fin mask FM21 of the dumbbell-shaped island type may increase the margin for covering the ends 114 of the active region 111. That is, the margin for reducing the chances of dummy saddle type fin generation at the ends 114 of the active region 111 may increase.

Figure 5B:
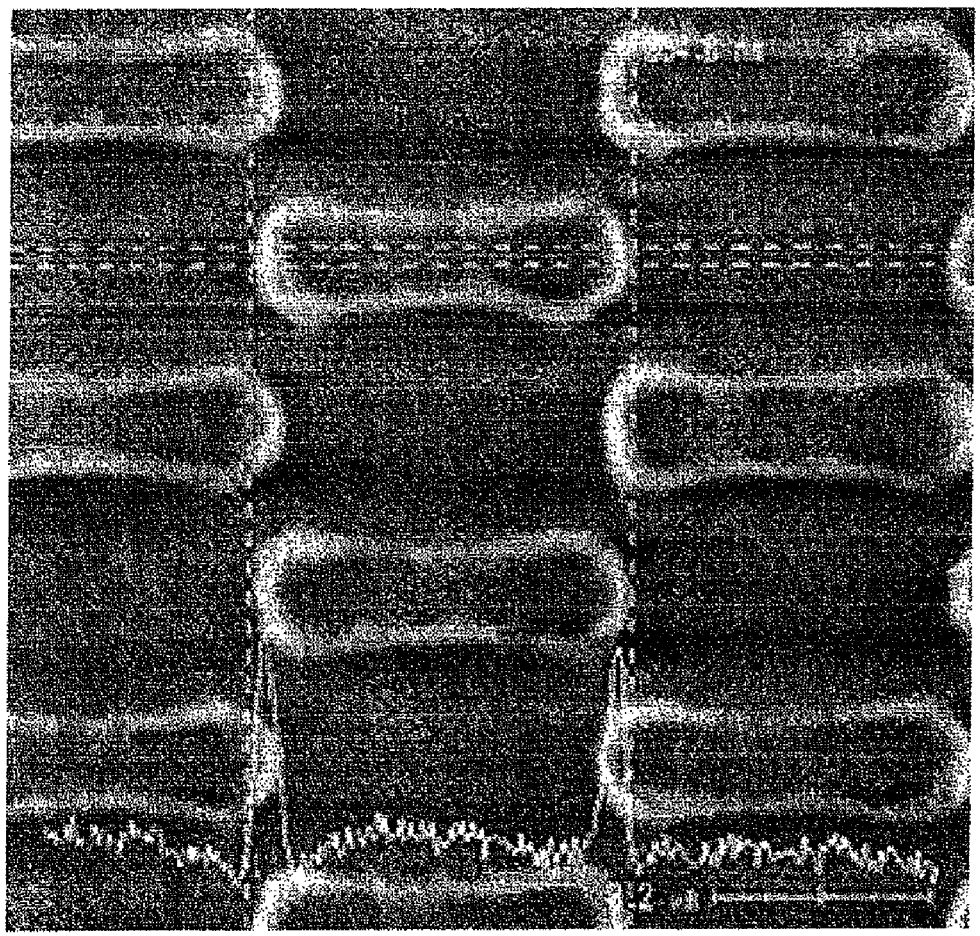
FIG. 5B illustrates a scanning electron microscopic (SEM) view of a second fin mask according to the second embodiment of the present invention.

The first fin mask FM11 and the second fin mask FM21 may be applied in a certain order (i.e., FM11→FM21 or FM21→FM11). A hard mask pattern transcribing the shape of the first fin mask FM11 and the second fin mask FM21 in combination is used as an etch barrier when forming the saddle type fins 113. The etch barrier may include an amorphous carbon pattern. The amorphous carbon pattern may be formed by employing the first fin mask FM11, the second fin mask FM21, a DARC layer, and a polysilicon hard mask. The amorphous carbon pattern may be formed using the method shown in FIGS. 3A to 3E. FIG. 5B illustrates a scanning electron microscopic (SEM) view of a second fin mask according to the second embodiment of the present invention.

FIG. 6A illustrates a plan view of a fin mask combination used in fabricating a saddle type fin according to a third embodiment of the present invention. The fin mask combination according to the third embodiment includes a first fin mask FM31 of a line type and a second fin mask FM32 of a jigsaw puzzle type for locally etching active regions 200 and an isolation structure to form saddle type fins 201.

The first fin mask FM31 is a line type mask exposing only the saddle type fin regions of the active regions 200, where the saddle type fins 201 are to be formed. The first fin mask FM31 is substantially the same as the first fin masks according to the first and second embodiments. The second fin mask FM32 is a jigsaw puzzle type mask. That is, the second fin mask FM32 having the jigsaw puzzle shape covers ends of the active regions 200 along a major axis as well as between the ends. Meanwhile, the second fin mask FM32 exposes the rest of the substrate structure through jigsaw puzzle openings 202. Regions exposed by the jigsaw puzzle openings 202 are locally etched to form the saddle type fins 201.

Using the second fin mask FM32 of jigsaw puzzle type according to the third embodiment may allow the selectivity of a photoresist layer to be maintained, which may otherwise be insufficient. Thus, the ends of the active regions 200 along the major axis where dummy saddle type fins often occur may be sufficiently covered.

Figure 6B:
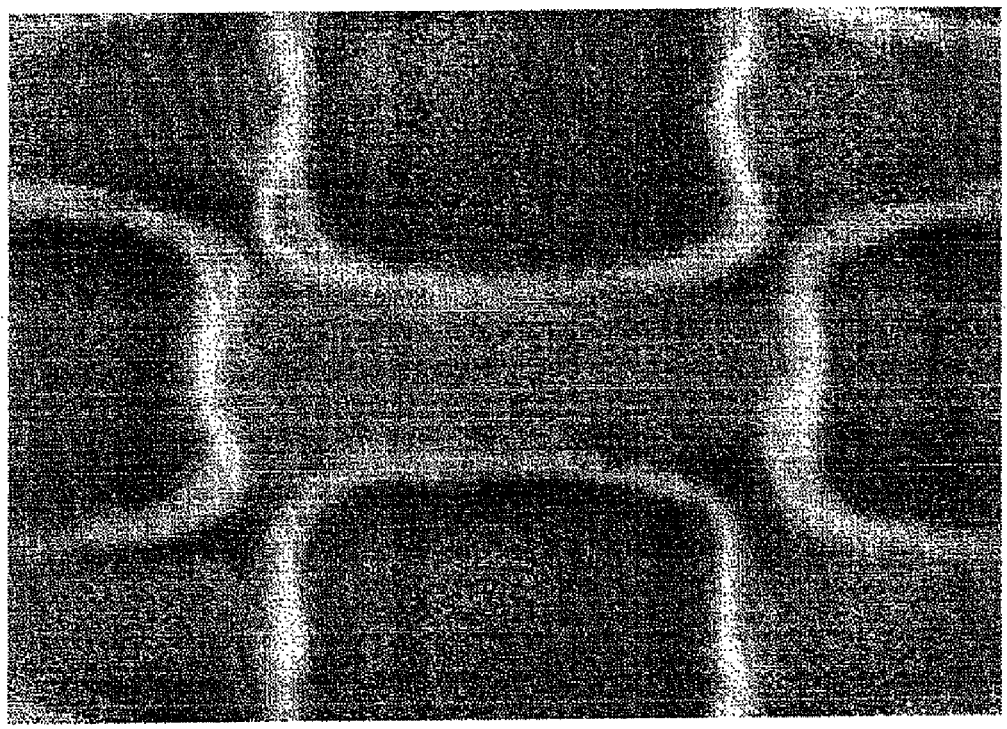
FIG. 6B illustrates a SEM view of a second fin mask shown in FIG. 6A.

The first fin mask FM31 and the second fin mask FM32 are applied in a certain order (i.e., FM31→FM32 or FM32→FM31). A hard mask pattern transcribing the shape of the first fin mask FM31 and the second fin mask FM32 in combination is used as an etch barrier pattern when forming the saddle type fins 201. The etch barrier pattern may include an amorphous carbon pattern. The amorphous carbon pattern may be formed by employing the first fin mask FM31, the second fin mask FM32, a DARC layer, and a polysilicon hard mask. The amorphous carbon pattern may be formed using the method shown in FIGS. 3A to 3E. FIG. 6B illustrates a SEM view of the second fin mask shown in FIG. 6A.

Figure 7A:
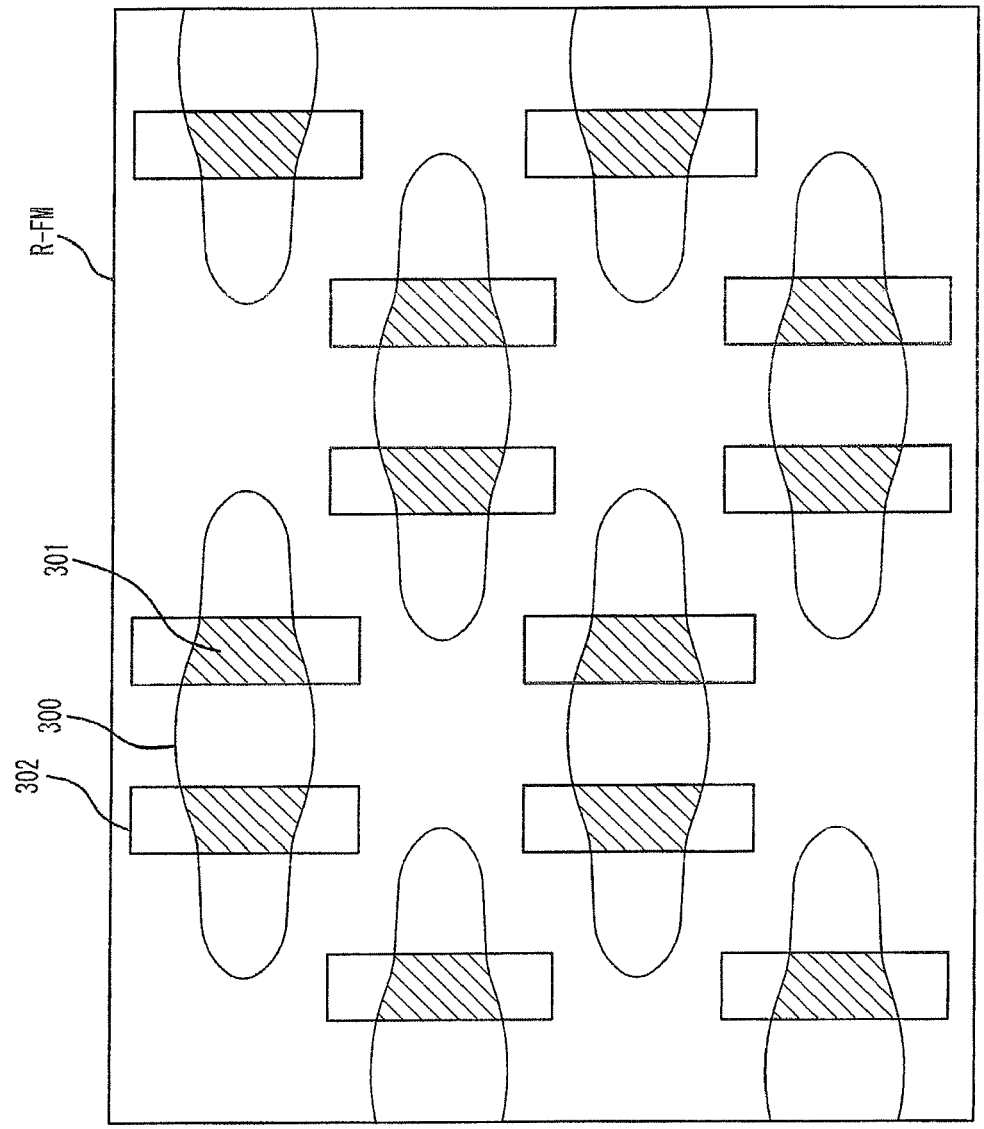
FIG. 7A illustrates a plan view of a fin mask used in fabricating a saddle type fin according to a fourth embodiment of the present invention.
Figure 7B:
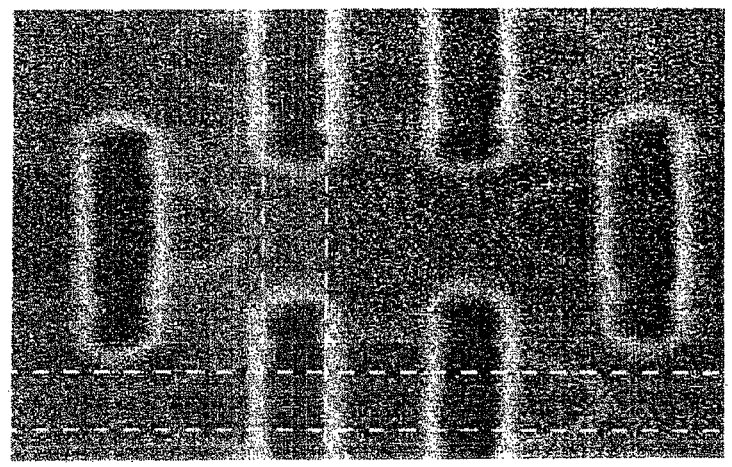
FIG. 7B illustrates a SEM view of a fin mask shown in FIG. 7A.

FIG. 7A illustrates a plan view of a fin mask used in fabricating a saddle type fin according to a fourth embodiment of the present invention. FIG. 7B illustrates a SEM view of the fin mask shown in FIG. 7A.

Referring to FIG. 7A, unlike the first to third embodiments, a fin mask R-FM having island-shaped openings 302 is used independently without using a line type first fin mask. That is, the fin mask R-FM having the openings 302 locally exposes saddle type fin regions of active regions 300, where saddle type fins 301 are to be formed. The rest of the substrate structure is covered by the fin mask R-FM. The openings 302 may have a rectangular shape as illustrated or an elliptical shape.

Using the fin mask R-FM having the island-shaped openings 302 independently may simplify the process when compared to using two fin masks. Also, using the fin mask R-FM according to the fourth embodiment generally does not require using a polysilicon hard mask. The saddle type fins 301 may be formed using only amorphous carbon. The saddle type fins 301 may include polysilicon instead of amorphous carbon. Therefore, a hard mask stack may be simply configured using the fin mask R-FM according to the fourth embodiment. For instance, an etch barrier pattern transcribing the shape of the fin mask R-FM is used as an etch barrier when forming the saddle type fins 301 using the fin mask R-FM according to the fourth embodiment. The etch barrier pattern may include an amorphous carbon pattern or a poylsilicon pattern. The etch barrier pattern may be formed by employing the fin mask R-FM and a DARC layer. The etch barrier pattern may be formed using the method shown in FIGS. 3A to 3E. According to the fourth embodiment, the DARC layer may be directly etched using the fin mask R-FM without using the polysilicon hard mask, and the amorphous carbon may be etched using the DARC layer. Also, polysilicon may be used as an etch barrier when forming the saddle type fins by forming polysilicon under the DARC layer instead of amorphous carbon.

Figure 8:
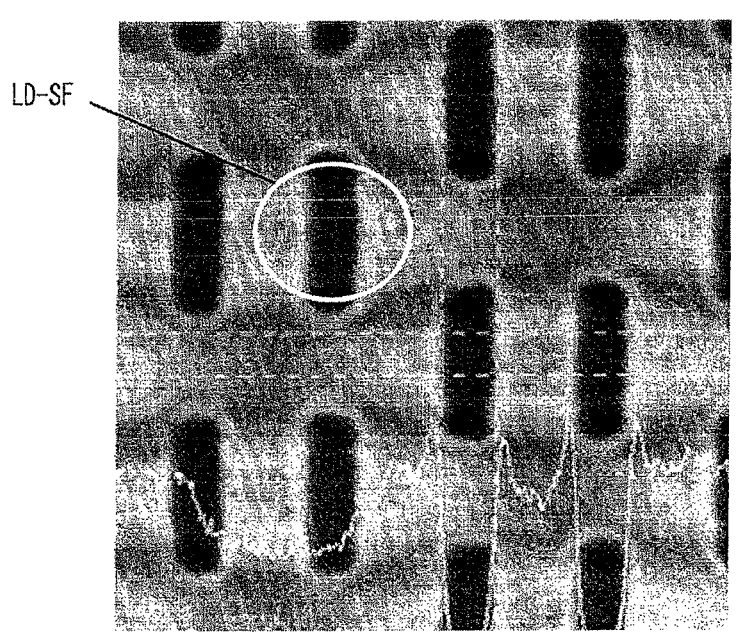
FIG. 8 illustrates a SEM view of saddle type fins according to embodiments of the present invention.

Saddle type fins may be formed in a local damascene form when the saddle type fins are formed using the fin mask combination or the independent fin mask R-FM according to the first to the fourth embodiments. Since the saddle type fin regions are limited and locally etched, the saddle type fins become local damascene saddle type fins (LD-SF). FIG. 8 illustrates a SEM view of saddle type fins according to embodiments of the present invention. The saddle type fins are formed as represented with 'LD-SF.'

While the present invention has been described with respect to specific embodiments, it will be apparent to those skilled in the art that various changes and modifications may be made without departing from the spirit and scope of the invention as defined in the following claims.

What is claimed is:

1. A method for fabricating a saddle type fin, the method comprising:
    providing a substrate defining at least two active regions that have neighboring ends in a major axis;
    forming a first mask layer over the substrate including the active regions;
    forming a second mask layer over the first mask layer;
    patterning the second mask layer by using a first fin mask as an etching mask;
    patterning the first mask layer by using an etching mask that includes a second fin mask and the patterned second mask layer, the patterned first mask layer having openings configured to fowl saddle type fin regions of the active regions, the patterned first mask layer covering the rest of the active regions; and
    etching the saddle type fin regions by using an etching mask that includes the patterned first mask layer to form saddle type fins in a local damascene structure,
    wherein one of the first and second fin masks is configured to exposes the saddle type fin regions in a line pattern and the other of the first and second fin masks is configured to cover the neighboring ends of the active regions.

2. The method of claim 1, wherein the openings are formed in a rectangular or an ellipse shape.

3. The method of claim 1, wherein at least one of the first mask layer or the second mask layer comprises polysilicon.

4. The method of claim 3, further comprising:
    forming an amorphous carbon layer over the substrate including the active regions, the first mask layer being formed over the amorphous carbon layer; and
    patterning the amorphous carbon layer by using an etching mask that includes the patterned first mask layer.

5. The method of claim 4, wherein the etching of the saddle type fin regions comprises using an etching mask that includes the patterned amorphous carbon layer.

6. The method of claim 5, wherein the second mask layer comprises polysilicon.

7. The method of claim 5, wherein:
    the first fin mask has openings configured to form the saddle type fin regions of the active regions; and
    the second fin mask is configured to cover neighboring ends of the active regions.

8. The method of claim 5, wherein:
    the second fin mask has openings configured to form the saddle type fin regions of the active regions; and
    the first fin mask is configured to cover neighboring ends of the active regions.

9. The method of claim 5, wherein the first mask layer comprises a dielectric anti-reflective coating layer.

10. The method of claim 9, wherein the second mask layer comprises polysilicon.

11. The method of claim 1, wherein the etching of the saddle type fin regions comprises using an etching mask that includes the patterned amorphous carbon layer.

12. The method of claim 11, wherein the first mask layer comprises a dielectric anti-reflective coating layer.

13. The method of claim 12, wherein the second mask layer comprises polysilicon.

14. The method of claim 1, wherein the second mask layer comprises polysilicon.

15. The method of claim 1, wherein:
the first fin mask has openings configured to form the saddle type fin regions of the active regions; and
the second fin mask is configured to cover neighboring ends of the active regions.

16. The method of claim 1, wherein:
the second fin mask has openings configured to form the saddle type fin regions of the active regions; and
the first fin mask is configured to cover neighboring ends of the active regions.

17. The method of claim 1, wherein at least one of the first fin mask or the second fin mask includes a patterned photoresist layer.

* * * * *